United States Patent [19]
GrosJean

[11] 3,959,735
[45] May 25, 1976

[54] LOUDSPEAKER AND AMPLIFIER PROTECTION CIRCUIT

[75] Inventor: Jon Paul GrosJean, Batavia, N.Y.

[73] Assignee: GTE Sylvania Incorporated, Stamford, Conn.

[22] Filed: June 16, 1975

[21] Appl. No.: 587,038

[52] U.S. Cl. .............................. 330/207 P; 179/1 A; 179/1 SW
[51] Int. Cl.² .......................................... H03F 21/00
[58] Field of Search ............ 330/207 P; 307/202 R; 179/1 A, 1 SW; 317/33 R

[56] References Cited
UNITED STATES PATENTS 3,365,675  1/1968  Gaddy et al. ...................... 330/192

*Primary Examiner*—James B. Mullins
*Attorney, Agent, or Firm*—Norman J. O'Malley; Thomas H. Buffton; Robert T. Orner

[57] ABSTRACT

In a signal receiver having a potential source and an amplifier stage connected to a loudspeaker, a loudspeaker and amplifier protection circuit includes a normally closed switch coupling the potential source to the amplifier stage and a protection circuit coupled to the output of the amplifier stage and responsive to positive or negative polarity DC potentials for activating the switch to disconnect the power supply from the amplifier stage.

12 Claims, 3 Drawing Figures

LOUDSPEAKER AND AMPLIFIER PROTECTION CIRCUIT

BACKGROUND OF THE INVENTION

Generally, a problem associated with signal receivers having one or more loudspeakers connected to direct-coupled audio power amplifiers is transistor failure in the amplifier. When a transistor in the amplifier fails, it is not uncommon for several amperes of DC current to appear at the loudspeaker. Not only may such excessive current be of an amount sufficient to destroy the loudspeaker but also may be of an amount sufficient to cause a fire at the loudspeaker. Moreover, such currents usually have a deleterious effect on the amplifier and may burn out several elements therein or even initiate a fire in the amplifier.

One of the common approaches to a solution of the above-described problem is the inclusion of circuit breakers in series with the leads of the loudspeaker. However, circuit breakers in series with the leads of the loudspeaker must be capable of carrying the AC current supplied to the loudspeakers and such currents can reach a figure of 2.5 to 4.5 amperes. Unfortunately, a DC current, derived from a fault condition, and of such an amount is more than enough to burn out any of the commonly employed loudspeakers.

Another known approach to the problem provides fuses in series with the loudspeaker leads or in the B+ or power supply circuitry coupled to the power amplifiers. Unfortunately, fuses are relatively slow acting, suffer from the same limitations as circuit breakers, and are somewhat unpredictable in response. Moreover, fuses are unacceptable because they would not normally be considered a customer replaceable item.

Still another approach to the problem included a triac crowbar circuit in the loudspeaker leads. Also, circuitry with a plurality of transistors and a relay have been utilized to protect the loudspeaker system. However, the above-mentioned circuitry has been found to be relatively expensive of components and installation labor. Moreover, increased components tend to increase the complexity and reduce the reliability of most electrical circuitry.

OBJECTS AND SUMMARY OF THE INVENTION

An object of the present invention is to provide circuitry for enhanced protection of a loudspeaker and amplifier of a signal receiver. Another object of the invention is to reduce the probability of fires and loudspeaker distruction in a signal receiver. Still another object of the invention is to enhance the safety and reliability of a signal receiver with relatively simple, low cost circuitry. A further object of the invention is to utilize relatively inexpensive solid state and passive devices to improve the protection of a loudspeaker and amplifier in a signal receiver.

These and other objects, advantages and capabilities are achieved in one aspect of the invention by an amplifier connected to a loudspeaker and by a normally closed switch to a potential source with protection circuitry responsive to positive or negative polarity DC potentials coupling the output of the amplifier to the switch to activate the switch and disconnect the potential source from the amplifier upon appearance of a DC potential at the loudspeaker.

PREFERRED EMBODIMENTS OF THE INVENTION

For a better understanding of the present invention, together with other and further objects, advantages and capabilities thereof, reference is made to the following disclosure and appended claims in connection with the accompanying drawings.

Figure 1:
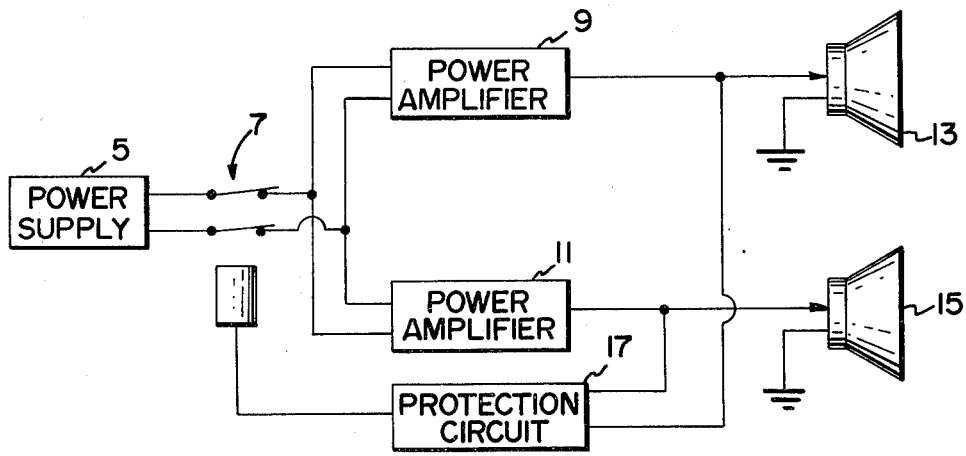
FIG. 1 is a block diagram illustrating the loudspeaker and amplifier protection system.

Referring to the drawings, FIG. 1 illustrates, in block form, a portion of a signal receiver. Therein, a power supply 5 is coupled by a normally closed switching means 7 to a pair of power amplifier stages 9 and 11 respectively. Each of the power amplifier stages 9 and 11 is connected to a loudspeaker 13 and 15 and to a protection circuit 17. The protection circuit 17 is coupled back to the switching means 7.

In operation, power is supplied from the power supply 5 via the switching means 7 to the power amplifier stages 9 and 11. The output of the power amplifier stages 9 and 11 is coupled to the loudspeakers 13 and 15 and to a protection circuit 17 which not only filters out AC potentials but also senses positive or negative polarity DC potentials. Upon sensing the positive or negative polarity DC potentials, the switching means 7 is activated to disconnect the power amplifier stages 9 and 11 from the power supply 5. Thus, the power amplifier stages 9 and 11 as well as the loudspeakers 13 and 15 are protected from excessive potentials which would be harmful to the apparatus and create a possible fire hazard condition.

Figure 2:
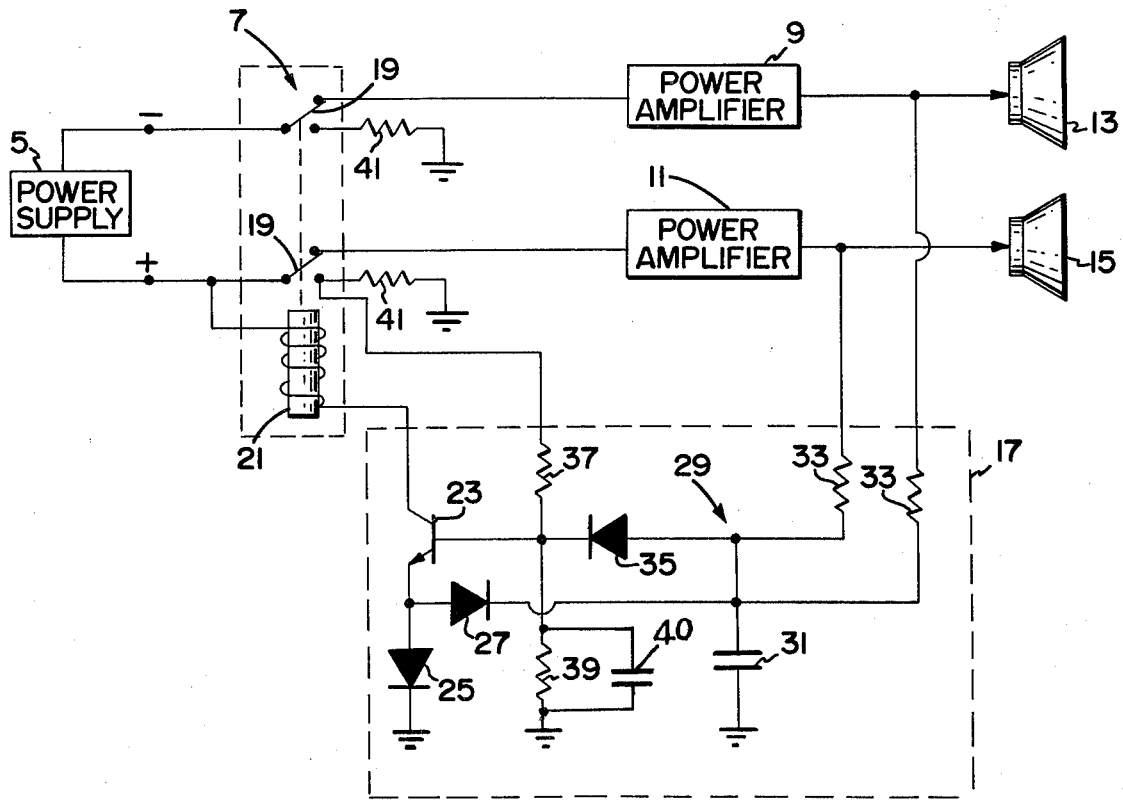
FIG. 2 is a schematic and block illustration of a preferred embodiment of the invention.

More specifically, FIG. 2, utilizing like numbers for similar parts of FIG. 1, includes a potential source 5 coupled by a switching means 7 to power amplifier stages 9 and 11 connected to loudspeakers 13 and 15. A protection circuit 17 couples the power amplifier stages 9 and 11 back to the switching means 7.

The switching means 7 includes a normally closed contact arm 19 for each of the power amplifier stages 9 and 11 coupled to the potential source 5. Each of these contact arms is mechanically coupled to a relay 21 having an electrical connection to the potential source 5 and to the output electrode or collector of a transistor 23 of the protection circuit 17.

The emitter of the transistor 23 is series connected by a first diode 25 to a potential reference level or circuit ground. The emitter of the transistor 23 is also connected by a second diode 27 to a filter circuit 29. The filter circuit 29 includes a capacitor 31 connected to circuit ground and by a resistor 33 to the output of each one of the power amplifiers 9 and 11 and to the loudspeakers 13 and 15.

The base of the transistor 23 is connected by a third diode 35, oppositely poled from the second diode 27, to the capacitor 31 and resistor 33 of the filter circuit 29. The base of the transistor 23 is also connected to a latching circuit including a resistor 37 coupled to the normally open contact of the switching means 7 and by a resistor 39 shunted by a capacitor 40 to circuit ground. Also, the normally open contact of the switching means 7 is coupled to circuit ground by a resistor 41.

As to operation, a dc potential of positive and negative polarity is derived from the potential source 5 and applied via the normally closed contact arms 19 of the switching means 7, to the amplifier stages 9 and 11, and in turn, to the loudspeakers 13 and 15.

The output of the amplifier stages 9 and 11 is applied to an AC filter means 29 whereby any AC signal present is shunted to a potential reference level or circuit ground. Should a positive polarity DC potential be applied via the diode 35 to the base of the transistor 23, current would flow therethrough causing energization of the relay coil 21. Thereupon, the normally closed contact arm 19 would open and the potential source 5 would be disconnected from the power amplifier stages 9 and 11.

Similarly, a negative polarity DC potential available at the output of an amplifier stage, 9 and 11, would be applied via the second diode 27 to the emitter of the transistor 23. Thereupon, current would flow therethrough energizing the relay 21 to activate the contact arm 19 and again disconnect the power source 5 from the power amplifiers 9 and 11.

Also, a latching circuit including a resistor 37 coupling the base of the transistor 23 to the resistor 41 and power source 5 via the now open contact arm 19 as well as the resistor 39 shunted by a by-pass capacitor 40 coupling the base of the transistor 23 to circuit ground provides continued operation of the switching means 7. Thus, a positive or negative polarity DC potential activates the switching means 7 to disconnect the potential source 5 from the power amplifiers 9 and 11 and the latching means maintains the disconnection.

Figure 3:
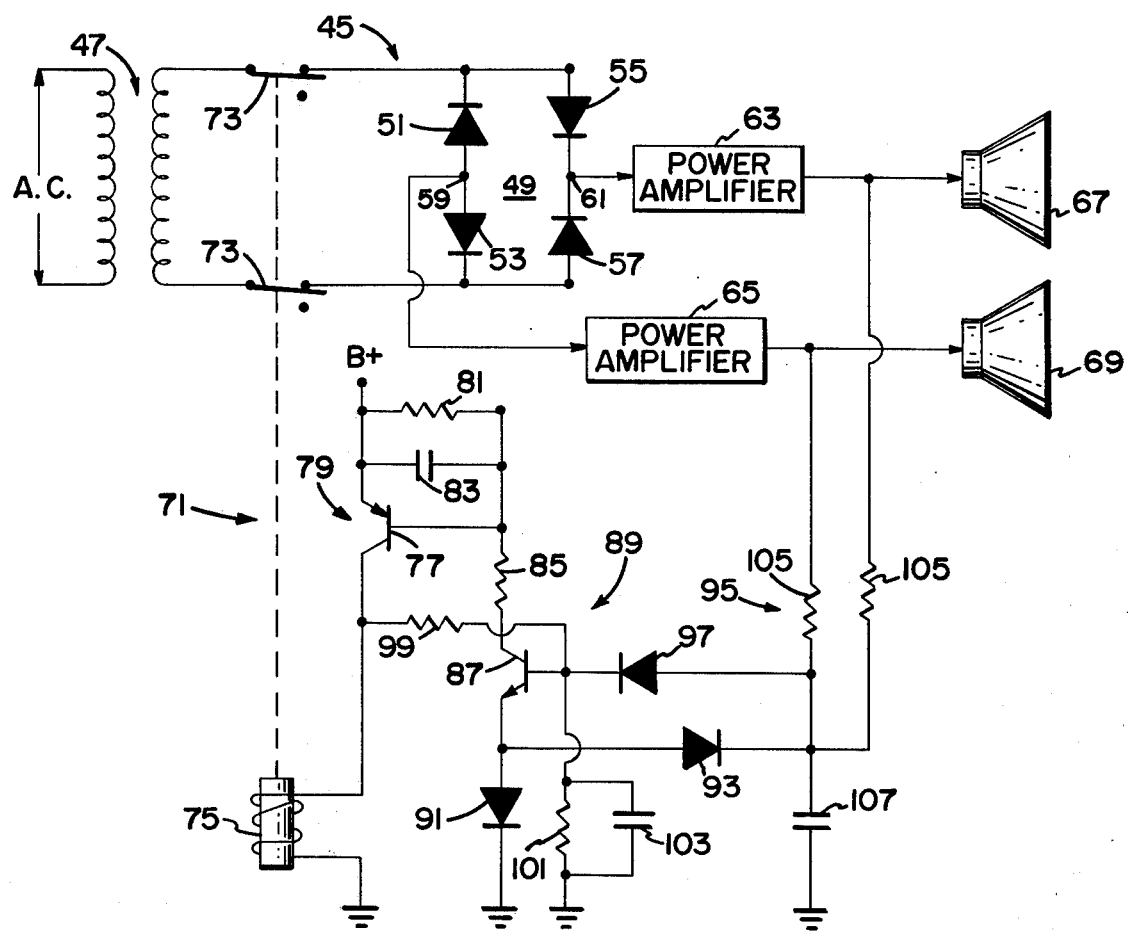
FIG. 3 is an alternate embodiment of the invention.

In another embodiment, FIG. 3 illustrates an AC potential source coupled to a power supply 45 having a transformer 47 and a bridge-type rectifier 49 including first and second pairs of oppositely-poled diodes 51 and 53 and 55 and 57 respectively. The bridge-type rectifier 49 has a pair of DC output terminals 59 and 61 connected to power amplifier stages 63 and 65 which, in turn, each have an output coupled to a loudspeaker, 67 and 69 respectively.

A switching means 71 includes a pair of normally closed contact arms 73 for selectively coupling the transformer 47 to the bridge-type rectifier 49 whereby the AC source is coupled to the power amplifier stages 63 and 65. The switching means 71 also includes a relay 75 mechanically coupled to the contact arms 73 and electrically connected to circuit ground and to the collector of a transistor 77 included in an amplifier stage 79.

The emitter of the transistor 77 of the amplifier stage 79 is connected to a potential source B+ and by way of a parallel connected resistor 81 and capacitor 83 to the base. The base of the transistor 77 is coupled by a resistor 85 to the collector of a transistor 87 in a protection circuit 89.

The emitter of the transistor 87 of the protection circuit 89 is coupled by a first diode 91 to circuit ground and by a second diode 93 to an AC filter circuit 95. The base of the transistor 87 is coupled by a third diode 97 to the AC filter circuit 95 and to a latching circuit including a resistor 99 connected to the relay 75 and collector of the transistor 77 and a parallel connected resistor 101 and by-pass capacitor 103 connected to circuit ground.

The AC filter circuit 95 includes a resistor 105 connected to each one of the power amplifier stages 63 and 65 and to the second and third diodes 93 and 97. A capacitor 107 AC couples the resistors 105 and second and third diodes 93 and 97 to circuit ground.

As in the previously described embodiment of FIG. 2 a potential appearing at the output of the power amplifier stages 63 and 65 or at the loudspeakers 67 and 69 is filtered by the AC filter circuit 95 whereby AC potentials are shunted to circuit ground. However, a positive polarity DC potential appearing at the output of the power amplifier stages 63 and 65 is coupled via the diode 97 to the base of the transistor 87 to cause current flow therethrough.

Thereupon, the potential appearing at the base of the transistor 77 is increased, current flow through the transistor 77 is increased, and the relay 75 of the switching means 71 operates to disconnect the AC potential source from the power amplifier stages 63 and 65 and protection for the power amplifier stages 63 and 65 and for the loudspeakers 67 and 69 is provided.

In a similar manner, a negative polarity DC potential appearing at the output of the power amplifier stages 63 and 65 is coupled via the second diode 93 to the emitter of the transistor 87 of the protection circuit 89. Thereupon, current flow through the transistor 87 is increased, the potential appearing at the base of the transistor 77 is increased, current flow through the transistor 77 is increased, and the relay 75 operates to disconnect the potential source from the power amplifier stages 63 and 65.

Additionally, an increase in current flow through the transistor 77 due to the appearance of positive or negative polarity DC potentials at the output of the amplifier stages 63 and 65 causes an increase in potential at the base of the transistor 87 via the latching circuit including resistor 99, resistor 101, and capacitor 103. Thus, the initial potentials and current flow are maintained and the switching means 71 continues to disconnect the potential source from the power amplifier stages 63 and 65.

Thus, there has been provided a unique amplifier and loudspeaker protection circuit having numerous advantages over other known techniques. The apparatus is relatively simple and inexpensive as compared with other known methods. Also, the technique does not require component replacement by the user nor expensive and unavailable replacement parts.

While there has been shown and described what is at present considered the preferred embodiments of the invention, it will be obvious to those skilled in the art that various changes and modifications may be made therein without departing from the invention as defined by the appended claims.

What is claimed is:

1. In a signal receiver having a potential source and an amplifier stage coupled to a loudspeaker, a loudspeaker and amplifier stage protection circuit comprising:

a switching means including a normally closed contact arm coupling said potential source to said amplifier stage;

means coupled to the output of said amplifier stage and to said loudspeaker for filtering an AC potential;

means coupled to said means for filtering an AC potential for coupling positive and negative polarity DC potentials; and means connected to said means for coupling positive and negative DC potentials and to said switching means for activating said switching means to disconnect said potential source from said power amplifier in response to the appearance of a DC potential at the output of said amplifier stage.

2. The loudspeaker and amplifier stage protection circuit of claim 1 including means connected to said means for activating said switching means and to said switching means for maintaining said switching means in an activated condition in response to initial activation thereof.

3. The loudspeaker and amplifier stage protection circuit of claim 1 wherein said switching means includes means for selective electrical connection of said potential source to said amplifier stage and a relay means mechanically coupled to said means for selective electrical connection and electrically connected to said means for activating said switching means in response to a DC potential appearing at the output of said amplifier stage.

4. The loudspeaker and amplifier protection circuit of claim 1 wherein said means for activating said switching means in response to a DC potential is in the form of an electron device coupled by a relay means of said switching means to said potential source and by a unidirectional conduction device to a potential reference level.

5. The loudspeaker and amplifier protection circuit of claim 1 wherein said means for coupling positive and negative polarity DC potentials is in the form of oppositely-poled unidirectional conduction devices coupling said means for filtering an AC potential to said means for activating said switching means in response to a DC potential.

6. The loudspeaker and amplifier protection circuit of claim 1 wherein said means for activating said switching means is in the form of an electron device having first and second input electrodes connected to said means for coupling positive and negative DC potentials and an output electrode connected to said switching means.

7. The loudspeaker and amplifier protection circuit of claim 2 wherein said means for maintaining said switching means in an activated condition includes a first impedance coupling said potential source to said means for activating said switching means and a second impedance connecting said means for activating said switching means to a potential reference level.

8. A loudspeaker and amplifier protection circuit for a signal receiver having a potential source and an amplifier stage connected to a loudspeaker comprising:
a switching means including a relay means electrically connected to said AC potential source and mechanically coupled to normally closed contacts coupling said potential source to said amplifier stage;
a series connected electronic switch and unidirectional conduction device coupling said relay means to a potential reference level;
an AC filtering means coupled to said loudspeaker and the output of said amplifier stage; and
positive and negative polarity DC coupling means connecting positive and negative polarity DC potentials from said AC filtering means to said series connected electronic switch and unidirectional conduction device whereby positive or negative polarity DC potentials appearing at the loudspeaker cause activation of said switching means to disconnect said potential source from said amplifier stage.

9. The loudspeaker and amplifier protection circuit of claim 8 wherein said positive and negative polarity DC coupling means are in the form of oppositely-poled diodes.

10. The loudspeaker and amplifier protection circuit of claim 8 wherein said electronic switch of said protection circuit is in the form of a transistor having an output electrode coupled to said relay means, and first and second input electrodes coupled to said positive and negative polarity DC coupling means with said second input electrode connected to said unidirectional conduction device coupled to a potential reference level.

11. The loudspeaker and amplifier protection circuit of claim 8 wherein said AC filtering means is in the form of a resistor coupled to said amplifier stage and to said positive and negative polarity DC coupling means with a capacitor connected to said potential reference level.

12. The loudspeaker and amplifier protection circuit of claim 8 wherein said series connected electronic switch and unidirectional conduction device are coupled by an amplifier stage to said relay means and to a potential source.

* * * * *